(12) United States Patent
Wang et al.

(10) Patent No.: US 10,001,515 B1
(45) Date of Patent: Jun. 19, 2018

(54) PHASE SHIFT DETECTOR

(71) Applicant: NATIONAL SUN YAT-SEN UNIVERSITY, Kaohsiung (TW)

(72) Inventors: Chua-Chin Wang, Kaohsiung (TW); Deng-Shian Wang, Kaohsiung (TW); Yu-Ting Tu, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days. days.

(21) Appl. No.: 15/426,123

(22) Filed: Feb. 7, 2017

(51) Int. Cl.
*G01R 25/00* (2006.01)
(52) U.S. Cl.
CPC .................................. *G01R 25/005* (2013.01)
(58) Field of Classification Search
CPC ... H01L 22/12; H01L 31/02019; H01L 31/09; H01L 17/941; G01R 19/0084; G01R 35/005; G01R 15/205; G01R 17/00; G01R 35/09
USPC .................................................. 327/2, 5, 12
See application file for complete search history.

(56) References Cited

U.S. PATENT DOCUMENTS 8,400,337 B1 * 3/2013 Xu ...................... H03F 3/45183
327/307

OTHER PUBLICATIONS

Yu-Ting Tu et al., An Accurate Phase Shift Detector Using Bulk Voltage Boosting Technique for Sensing Applications, Circuits and Systems (ISCAS), 2016 IEEE International Symposium, Date of Conference: May 22-25, 2016.

* cited by examiner

*Primary Examiner* — John Poos
(74) *Attorney, Agent, or Firm* — Jackson IPG PLLC; Demian K. Jackson

(57) ABSTRACT

A phase shift detector comprises a comparator for detecting phase information of a signal and an offset calibration circuit. In order to prevent input offset voltage of the comparator from affecting phase detection accuracy, bulk voltage is inputted to the comparator from the offset calibration circuit to adjust threshold voltage of transistor in the comparator for compensating input offset voltage of the comparator and improving accuracy of the phase shift detector.

16 Claims, 6 Drawing Sheets

| Original offset (mV) | Calibrated offset (mV) | improvement (%) |
|---|---|---|
| 40 | 4.34 | 89.15 |
| 30 | 6.58 | 78.07 |
| 20 | 1.62 | 91.90 |
| 10 | 0.71 | 92.90 |
| -10 | -2.33 | 76.70 |
| -20 | -3.23 | 83.85 |
| -30 | -2.32 | 92.27 |
| -40 | -5.59 | 86.02 |

PHASE SHIFT DETECTOR

FIELD OF THE INVENTION

This invention generally relates to a phase shift detector, and more particularly to a phase shift detector with offset compensation.

BACKGROUND OF THE INVENTION

Phase shift detector (PSD) is utilized to detect the phase difference caused by signal shift, and it can be applied to different fields, like optics, chemistry and communication fields. In optics, pulsed light is sent into nonlinear crystal, and crystal correlation coefficient can be obtained by the measured phase difference from the PSD. In chemistry, the phase difference measured by the PSD can be utilized to analyze the characteristic of chemical element. And the PSD also can be applied to clock and data recovery (COR), wireless receiver and phase shift modulator in communication field. The phase difference is utilized to perform matter analysis or data operation in each application, so how to precisely detect the signal phase for improving whole system accuracy is an important issue in recent years.

With reference to FIG. 7, it is a block diagram of a conventional phase frequency detection system. The conventional phase frequency detection system which includes a phase frequency detector (PFD), a charge pump, a loop filter, a voltage-controlled oscillator (VCO) and a frequency divider (DIV) can capture input signal phase by phase locked loop (PLL). However, the charge pump will stop charging and discharging because the PLL is stable and the PFD is not stable yet in PLL actual operation, so cause the VCO stop operating and generate an undetected phase zone which is called dead zone, and the range of the dead zone will affect whole system accuracy.

SUMMARY

The primary object of the present invention is to provide a phase shift detector which can avoid dead zone generation by novel architecture and can detect full signal phase for improving whole system accuracy.

The phase shift detector of the present invention comprises a comparator and an offset calibration circuit. The comparator includes a first-stage circuit with a first input end and a second input end, a second-stage circuit and a third-stage circuit. The second-stage circuit electrically connected to the first-stage circuit includes a first-controlled transistor and a second-controlled transistor, and outputs a first output voltage and a second output voltage. The third-stage circuit is electrically connected to the second-stage circuit and outputs a reference output voltage. The offset calibration circuit is electrically connected to the comparator and receives the first output voltage, the second output voltage and the reference output voltage. And the offset calibration circuit outputs a first bulk voltage and a second bulk voltage to the first-controlled transistor and the second-controlled transistor respectively according to the first output voltage, the second output voltage and the reference output voltage, for controlling a threshold voltage of the first-controlled transistor or the second-controlled transistor.

The phase shift detector of the present invention can detect signal phase, and cancel offset voltage by the offset calibration circuit to detect phase and measure phase difference precisely for improving whole system accuracy.

DETAILED DESCRIPTION OF THE INVENTION

Figure 1:
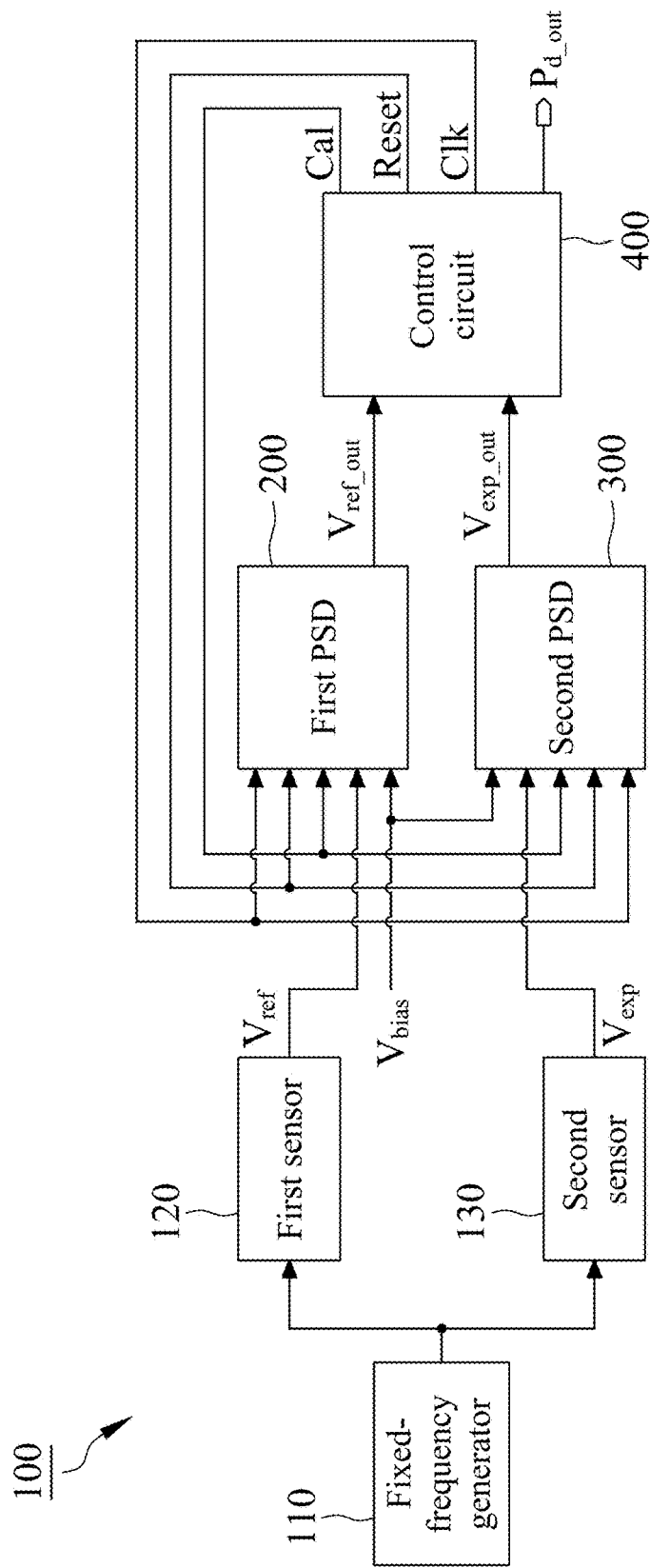
FIG. 1 is a functional block diagram illustrating a phase shift detection system in accordance with an embodiment of the present invention.

With reference to FIG. 1, it is a functional block diagram of a phase shift detection system 100 in accordance with an embodiment of the present invention. The phase shift detection system 100 includes a fixed-frequency generator 110, a first sensor 120, a second sensor 130, a first phase shift detector (PSD) 200, a second phase shift detector (PSD) 300 and a control circuit 400. In order to prevent the phase shift detection system 100 from generating error during signal transformation for square wave or phase difference measurement, the first sensor 120 and the second sensor 130 are regarded as experimental group and control group respectively for processing signal by differential operation. The sensor regarded as experimental group carries and detects a sample to output a sensing signal, and computes with output signal of the sensor regarded as control group to obtain precise result and cancel environment effect simultaneously. The fixed-frequency generator 110 is used to generate a signal with fixed frequency, and the signal with fixed-frequency is inputted to the first sensor 120 and the second sensor 130, wherein the first sensor 120 and the second sensor 130 can output a reference voltage $V_{ref}$ and an experimental voltage $V_{exp}$ respectively after sensing. In this embodiment, the first sensor 120 and the second sensor 130 can be, but not limit to, surface acoustic wave sensor (SAW sensor) applied to direct methanol fuel cell (DMFC) for sensing methanol concentration, or can be, but not limit to, flexural plate wave sensor (FPW sensor) applied for sensing severe acute respiratory syndrome coronavirus (SARS-CoV).

With reference to FIG. 1, the first PSD 200 and the second PSD 300 are respectively and electrically connected to the first sensor 120 and the second sensor 130 for receiving the reference voltage $V_{ref}$ and the experimental voltage $V_{exp}$ respectively, and then the first PSD 200 and the second PSD 300 can output a reference output voltage $V_{ref\_out}$ and a experimental output voltage $V_{exp\_out}$ respectively.

With reference to FIG. 1, the control circuit 400 outputs a calibration signal Cal, a reset signal Reset and a clock signal Clk to the first PSD 200 and the second PSD 300, wherein the calibration signal Cal is used to control the first PSD 200 and the second PSD 300 operating in a calibration mode or a normal mode, and the reset signal Reset is used to control the first PSD 200 and the second PSD 300 operating in a reset mode.

Circuit schematic and circuit operation for measuring phase difference of the first PSD 200 and the second PSD 300 are identical, so only the first PSD 200 will be described in more detail below.

Figure 2:
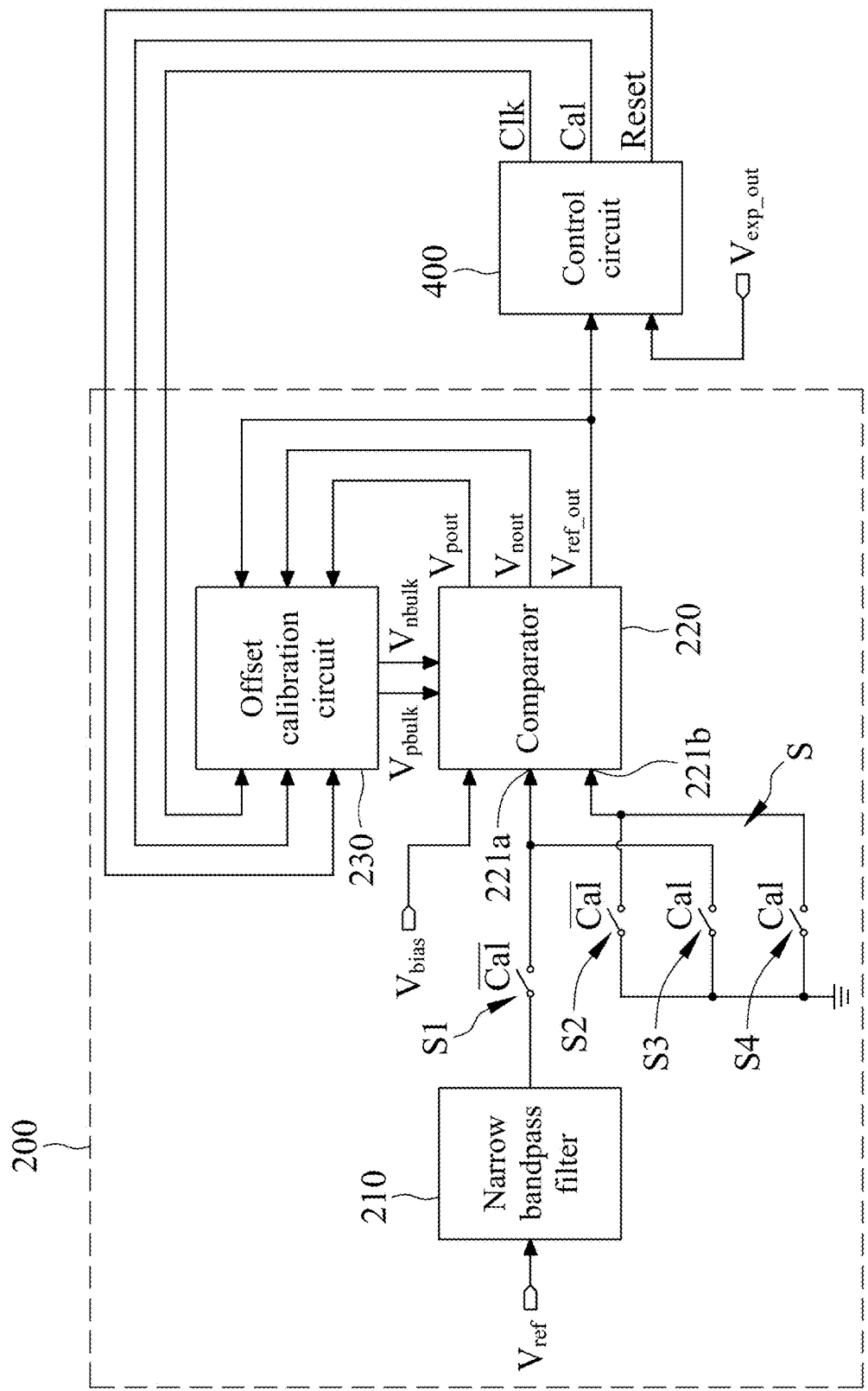
FIG. 2 is a functional block diagram illustrating a phase shift detector (PSD) in accordance with the embodiment of the present invention.
Figure 3:
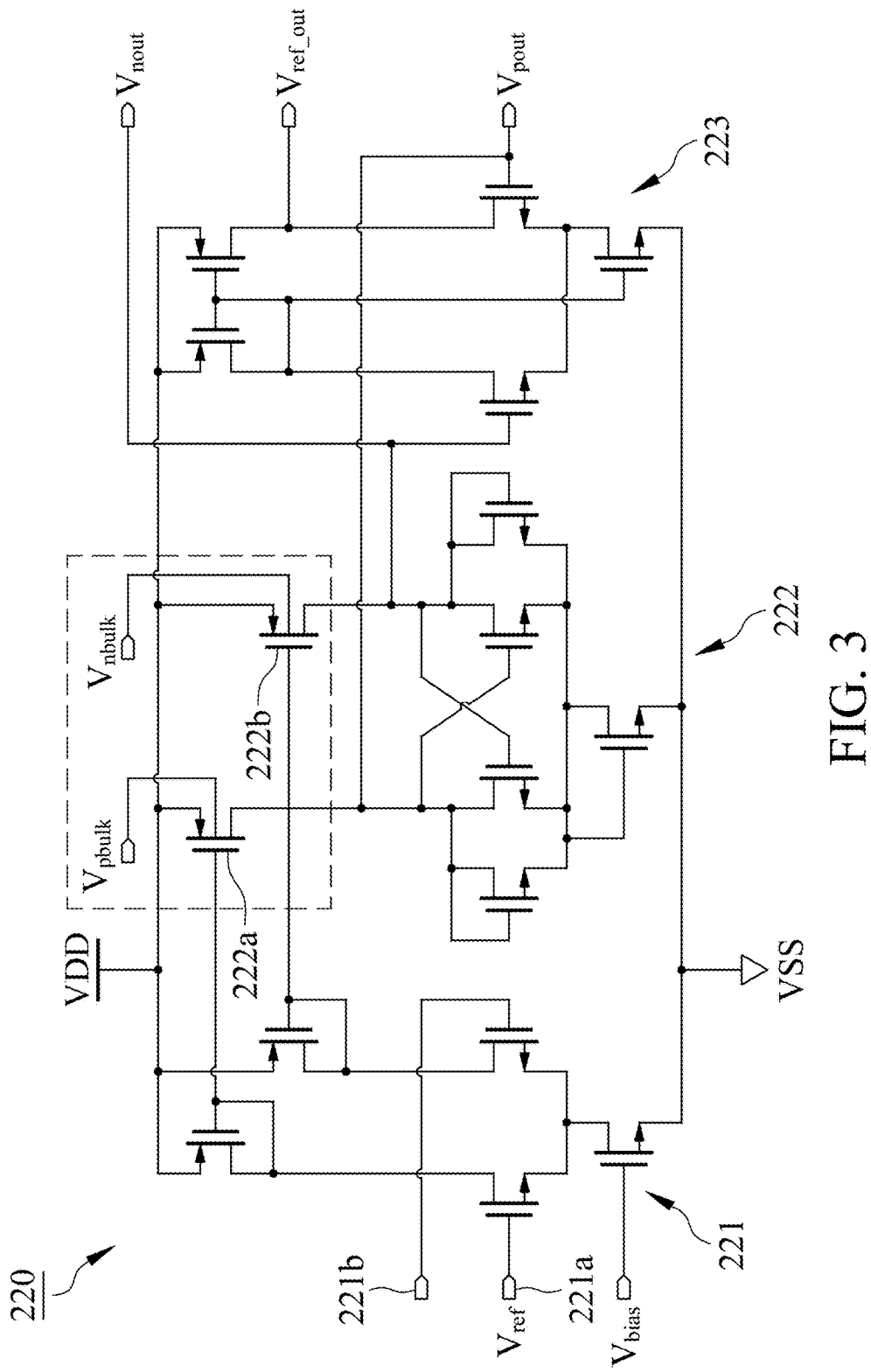
FIG. 3 is a circuit diagram illustrating a comparator in accordance with the embodiment of the present invention.

With reference to FIG. 2, it is a functional block diagram of the first PSD 200. In this embodiment, the first PSD 200 includes a narrow bandpass filter 210, a comparator 220, a offset calibration circuit 230 and a switch set S which is electrically connected to the narrow bandpass filter 210, wherein the narrow bandpass filter 210 is electrically connected to the first sensor 120 for receiving the reference voltage $V_{ref}$ and is used to filter the reference voltage $V_{ref}$ for preventing coupled noise and providing a high gain. In this embodiment, the switch set S includes four switches S1, S2, S3 and S4 which are controlled by the calibration signal Cal and a reverse-calibration signal $\overline{Cal}$ respectively, wherein the switches S1 and S2 are controlled by the reverse-calibration signal $\overline{Cal}$, and the switches S3 and S4 are controlled by the calibration signal Cal. With reference to FIGS. 2 and 3, the comparator 220 includes first-stage circuit 221, a second-stage circuit 222 and a third-stage circuit 223, wherein the first-stage circuit 221 has a first input end 221a and a second input end 221b. By the control of the switch set S, the first input end 221a of the first-stage circuit 221 can selectively receive the sensing signal via the switch set S and the narrow bandpass filter 210, or ground via the switch set S, and the second input end 221b of the first-stage circuit 221 grounds via the switch set S. The second-stage circuit 222 is electrically connected to the first-stage circuit 221 and includes a first-controlled transistor 222a and a second-controlled transistor 222b, wherein the second-stage circuit 222 can output a first output voltage $V_{pout}$ and a second output voltage $V_{nout}$. The third-stage circuit 223 is electrically connected to the second-stage circuit 222 and can output the reference output voltage $V_{ref\_out}$.

Owing to the non-ideal comparator 220 exist input offset voltage which will affect output accuracy of the comparator 220, the present invention utilizes the offset calibration circuit 230 to cancel the offset voltage.

With reference to FIG. 2, the offset calibration circuit 230 is electrically connected to the comparator 220 for receiving the first out voltage $V_{pout}$, the second output voltage $V_{nout}$ and the reference output voltage $V_{ref\_out}$, and can output a first bulk voltage $V_{pbulk}$ and a second bulk voltage $V_{nbulk}$ to the first-controlled transistor 222a and the second-controlled transistor 222b respectively according to the first output voltage $V_{pout}$, the second output voltage $V_{nout}$ and the reference output voltage $V_{ref\_out}$.

With reference to FIG. 3, the first bulk voltage $V_{pbulk}$ and the second bulk voltage $V_{nbulk}$ are inputted to a bulk end of the first-controlled transistor 222a and a bulk end of the second-controlled transistor 222b respectively for controlling a threshold voltage of the first-controlled transistor 222a or the second-controlled transistor 222b. The threshold voltage of the first-controlled transistor 222a and the second-controlled transistor 222b is presented as:

$$V_{tb} = V_{t0} + \gamma \times (\sqrt{V_{SB} + 2\phi_B} - \sqrt{2\phi_B})$$

wherein $V_{tb}$ is the threshold voltage of the first-controlled transistor 222a or the second-controlled transistor 222b, $V_{SB}$ is voltage difference between the bulk end and a source end of the first-controlled transistor 222a or the second-controlled transistor 222b, $V_{t0}$ is the threshold voltage of the first-controlled transistor 222a or the second-controlled transistor 222b when $V_{SB}$ is zero, $\gamma$ is body effect parameter, and $\phi_B$ is surface to bulk potential. It can be seen that the voltage difference between the bulk end and the source end of the first-controlled transistor 222a or the second-controlled transistor 222b is changeable when inputting the first bulk voltage $V_{pbulk}$ to the bulk end of the first-controlled transistor 222a or inputting the second bulk voltage $V_{nbulk}$ to the bulk end of the second-controlled transistor 222b. So the threshold voltage of the first-controlled transistor 222a or the second-controlled transistor 222b can be changed for reducing input offset voltage.

Figure 4:
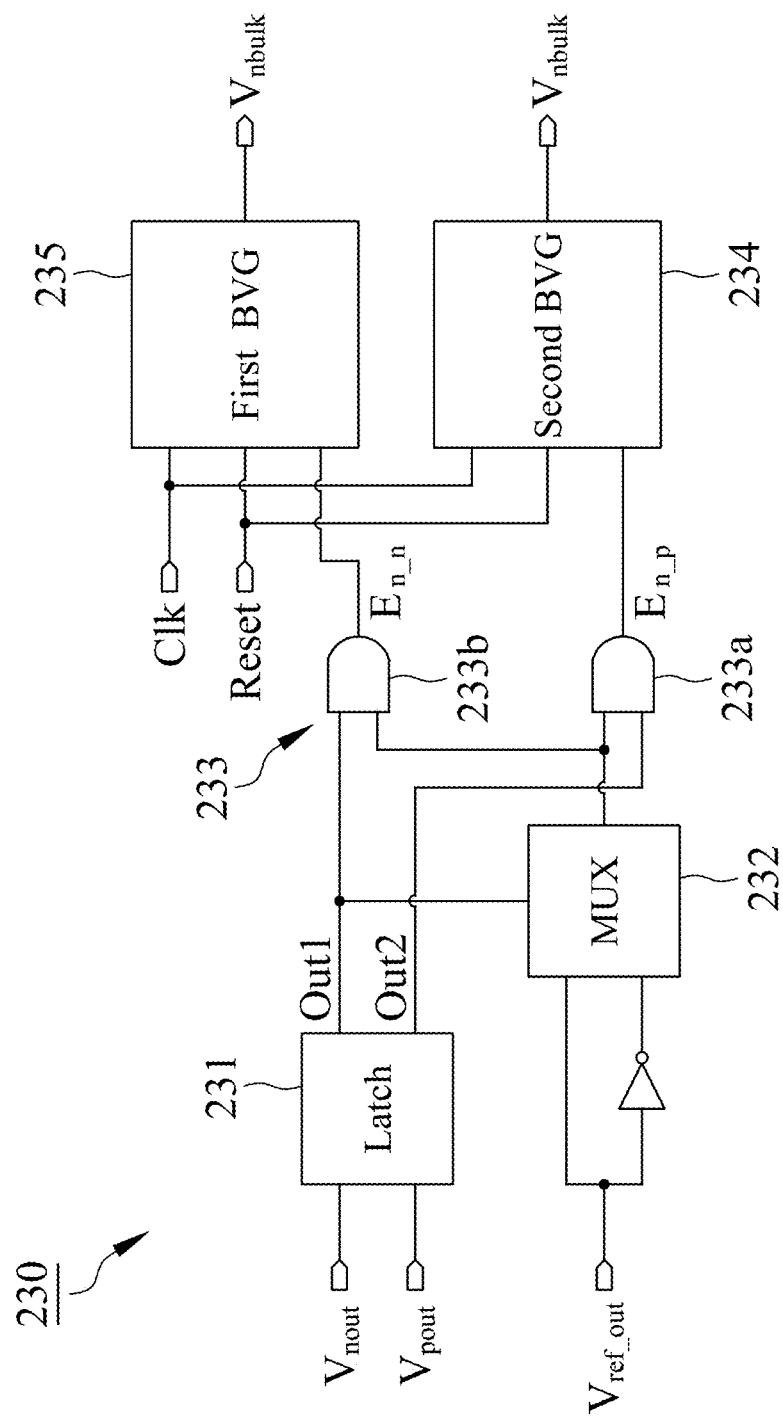
FIG. 4 is a functional block diagram illustrating an offset calibration circuit in accordance with the embodiment of the present invention.

With reference to FIG. 4, the offset calibration circuit 230 includes a latch 231, a multiplexer (MUX) 232, a logic gate set 233, a first bulk voltage generator (BVG) 234 and a second bulk voltage generator (BVG) 235. The latch 231 can receive the first output voltage $V_{pout}$ and the second output voltage $V_{nout}$, and can output a first latch voltage Out1 and a second latch voltage Out2. The MUX 232 can receive the reference output voltage $V_{ref\_out}$, the reverse reference output voltage $\overline{V_{ref\_out}}$ and the first latch voltage Out1, and can selectively output the reference output voltage $V_{ref\_out}$ or the reverse reference output voltage $\overline{V_{ref\_out}}$ according to the first latch voltage Out1. The logic gate set 233 can receive the first latch voltage Out1, the second latch voltage Out2, and the reference output voltage $V_{ref\_out}$ or the reverse reference output voltage $\overline{V_{ref\_out}}$ outputted from the MUX 232. And the logic gate set 233 can respectively output a first enable signal $E_{n\_p}$ and a second enable signal $E_{n\_n}$ to the first BVG 234 and the second BVG 235. In addition, the first BVG 234 and the second BVG 235 can further receive the clock signal Clk and the reset signal Reset, and can output the first bulk voltage $V_{pbulk}$ and the second bulk voltage $V_{nbulk}$ respectively.

In this embodiment, the logic gate set 233 includes a first AND gate 233a and a second AND gate 233b. The first AND gate 233a can receive the second latch voltage Out2, and the reference output voltage $V_{ref\_out}$ or the reverse reference output voltage $\overline{V_{ref\_out}}$ outputted from the MUX 232, and can output the first enable signal $E_{n\_p}$. The second AND gate 233b can receive the first latch voltage Out1, and the reference output voltage $V_{ref\_out}$ or the reverse reference output voltage $\overline{V_{ref\_out}}$ outputted from the MUX 232, and can output the second enable signal $E_{n\_n}$.

The circuit schematic of the first BVG 234 and the second BVG 235 are identical and the only difference between the first BVG 234 and the second BVG 235 is the input signal (the first enable signal $E_{n\_p}$ or the second enable signal $E_{n\_n}$), so only the first BVG 234 will be described in more detail below.

Figures 5, 6:
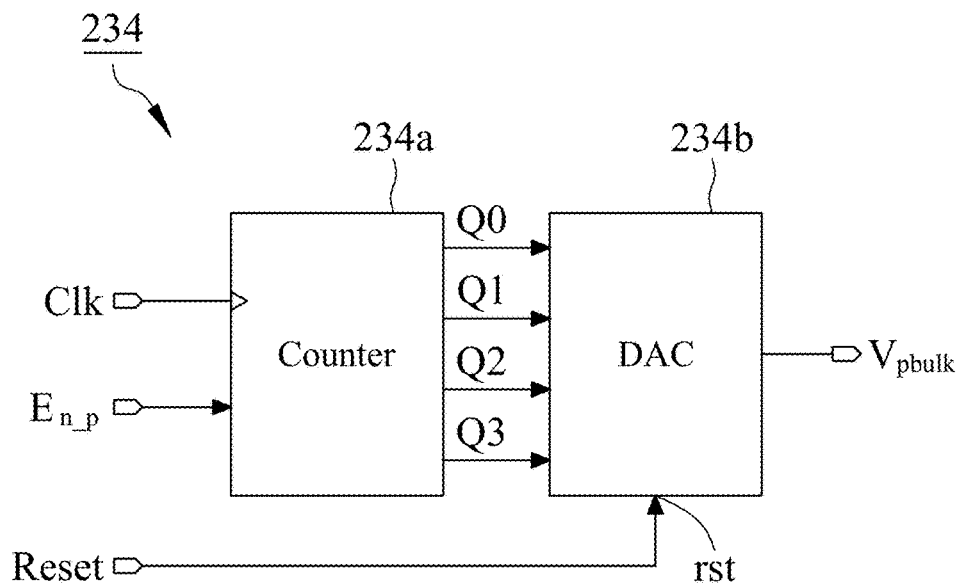
FIG. 5 is a functional block diagram illustrating a bulk voltage generator (BVG) in accordance with the embodiment of the present invention.
FIG. 6 is a table showing original and calibrated offset voltage of the phase shift detector.
Figure 7:
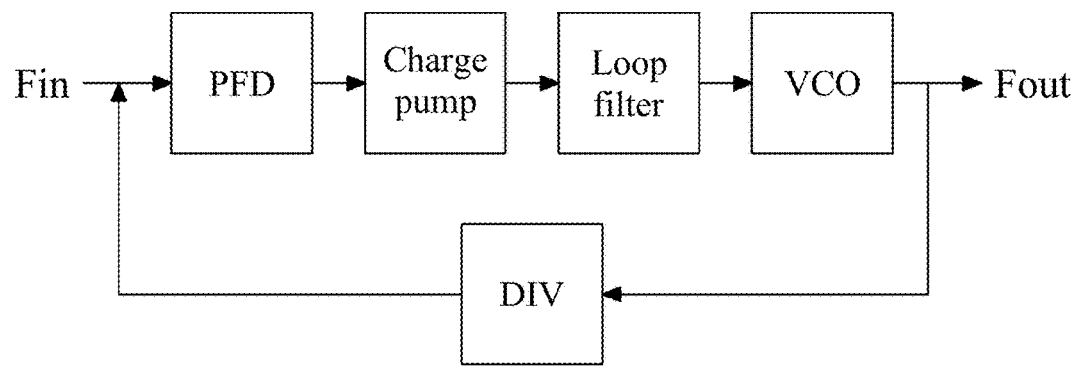
FIG. 7 is functional block diagram illustrating a conventional phase locked loop (PLL).

With reference to FIG. 5, the first BVG 234 includes a counter 234a and a digital-to-analog converter (DAC) 234b. The counter 234a can receive the clock signal Clk and the first enable signal $E_{n\_p}$, and can count up according to the clock signal Clk and the first enable signal $E_{n\_p}$ to output a counting signal Q0-Q3, wherein the DAC 234b transfers the counting signal Q0-Q3 into the first bulk voltage $V_{pbulk}$. Preferably, the DAC 234b of the first BVG 234 has a reset end rst, wherein the reset signal Reset is transmitted to the reset end rst of the DAC 234b directly to reset the DAC 234b.

With reference to FIGS. 1 and 2, the circuit operation of the phase shift detection system 100 is firstly switch the first PSD 200 and the second PSD 300 to the calibration mode to calibrate for reducing input offset voltage, and then the calibrated first PSD 200 and the calibrated second PSD 300 are switched to the normal mode for phase difference measurement. And the first PSD 200 and the second PSD 300 can be switched to the reset mode during the normal mode to reset the DAC 234b for preventing the first bulk voltage $V_{pbulk}$ and the second bulk voltage $V_{nbulk}$ from pulling down.

With reference to FIGS. 2 and 3, the calibration signal Cal outputted from the control circuit 400 will be pulled up in the calibration mode to make the first input end 221a and the second input end 221b of the first-stage circuit 221 of the comparator 220 ground through the switched S3 and S4. At this time, the first output voltage $V_{pout}$, the second output voltage $V_{nout}$ and the reference output voltage $V_{ref\_out}$ outputted from the comparator 220 are varied owing to the offset voltage of the comparator 220.

With reference to FIG. 3, in this embodiment, the first output voltage $V_{pout}$ is low, the second output voltage $V_{pout}$ is high and the reference output voltage $V_{ref\_out}$ is low if the offset voltage of the comparator 220 is positive. With reference to FIG. 4, the first latch voltage Out1 outputted from the latch 231 is low, the second latch voltage Out2 outputted from the latch 231 is high, and the MUX 232 selects to output the reverse reference output voltage $V_{ref\_out}$. The first AND gate 233a receives the second latch voltage Out2 and the reverse reference output voltage $V_{ref\_out}$ to pull up the first enable signal $E_{n\_p}$, and the second AND gate 233b receives the first latch voltage Out1 and the reverse reference output voltage $V_{ref\_out}$ to pull down the second enable signal $E_{n\_n}$. Therefore, the first enable signal $E_{n\_p}$ turns on the first BVG 234 and the second enable signal $E_{n\_n}$ turns off the second BVG 235 to make the counter 234a of the first BVG 234 start counting to pull up the first bulk voltage $V_{pout}$ for canceling the positive offset voltage.

By contrast, the first output voltage $V_{pout}$ is high, the second output voltage $V_{nout}$ is low and the reference output voltage $V_{ref\_out}$ is high if the offset voltage of the comparator 220 is negative. With reference to FIG. 4, the first latch voltage Out1 outputted from the latch 231 is high, the second latch voltage Out2 outputted from the latch 231 is low and the MUX 232 selects to output the reference output voltage $V_{ref\_out}$. The first AND gate 233a receives the second latch voltage Out2 and the reference output voltage $V_{ref\_out}$ to pull down the first enable signal $E_{n\_p}$, and the second AND gate 233b receives the first latch voltage Out1 and the reference output voltage $V_{ref\_out}$ to pull up the second enable signal $E_{n\_n}$. Therefore, the first enable signal $E_{n\_p}$ turns off the first BVG 234 and the second enable signal $E_{n\_n}$ turns on the second BVG 235 to make the counter 234a of the first BVG 234 start counting to pull up the second bulk voltage $V_{nout}$ for canceling the negative offset voltage.

If the reference output voltage $V_{ref\_out}$ is flipped (from high to low or from low to high) in the calibration mode, it means the offset voltage has been cancelled, so the calibration mode is finished and into the normal mode. With reference to FIGS. 1 and 2, the clock signal Clk outputted from the control circuit 400 can stop the counter in the normal mode for holding the level of the first bulk voltage $V_{pbulk}$ or the second bulk voltage $V_{nbulk}$, and the calibration signal Cal outputted from the control circuit 400 is pulled down. The first input end 221a of the comparator 220 is connected to the narrow bandpass filter 210 for receiving the reference voltage $V_{ref}$ and is grounded to compare the reference voltage $V_{ref}$ and zero potential and output the reference output voltage $V_{ref\_out}$. In the same way, the second PSD 300 also compares the experiment voltage $V_{exp}$ and zero potential and outputs the experiment output voltage $V_{exp\_out}$. With reference to FIG. 1, the control circuit 400 can process signal to obtain a phase detection output signal $P_{d\_out}$ after receiving the reference output voltage $V_{ref\_out}$ and the experiment output voltage $V_{exp\_out}$, and obtain related information of the sample according to the phase detection output signal $P_{d\_out}$.

With reference to FIGS. 4 and 5, the DAC 234b is capacitive DAC which may cause leakage current and discharge over time to pull down the level of the first bulk voltage $V_{pbulk}$ or the second bulk voltage $V_{nbulk}$, and affect offset voltage calibration, so inserting the reset mode during the normal mode to reset the DAC 234b. When the phase shift detection system 100 is operated in the reset mode, the reset signal Reset is pulled high to reset the DAC 234b and hold the level of the first bulk voltage $V_{pbulk}$ or the second bulk voltage $V_{nbulk}$.

With reference to FIG. 6, it shows original (without calibration) and calibrated offset voltage of the phase shift detection system 100 of the present invention. It can be seen that the offset voltage is effectively cancelled ranging from 40 mV to −40 mV, and the improvement efficiency is between 76.7% and 92.9%.

The phase shift detector of the present invention can detect signal phase, and can cancel offset voltage by the offset calibration circuit to detect phase and measure phase difference precisely for improving whole system accuracy.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A phase shift detector comprising:
   a comparator including:
      a first-stage circuit with a first input end and a second input end,
      a second-stage circuit electrically connected to the first-stage circuit and including a first-controlled and a second-controlled transistors and outputting a first and a second output voltages, and
      a third-stage circuit electrically connected to the second-stage circuit and which outputs a reference output voltage; and
   an offset calibration circuit electrically connected to the comparator and receiving the first output voltage, the second output voltage and the reference output voltage, wherein the offset calibration circuit outputs a first bulk voltage and a second bulk voltage to the first-controlled transistor and the second-controlled transistor respectively according to the first output voltage, the second output voltage and the reference output voltage for controlling a threshold voltage of the first-controlled transistor or the second-controlled transistor and wherein the first-controlled and second-controlled transistors are the only transistors in the comparator that are controlled by the offset calibration circuit.

2. The phase shift detector in accordance with claim 1, wherein the first bulk voltage and the second bulk voltage are respectively outputted to a bulk end of the first-controlled transistor and a bulk end of the second-controlled transistor.

3. The phase shift detector in accordance with claim 1, wherein the threshold voltage of the first-controlled transistor or of the second-controlled transistor is presented as:

$$V_{th} = V_{t0} + \gamma \times (\sqrt{V_{SB} + 2\phi_B} - \sqrt{2\phi_B})$$

wherein $V_{tb}$ is the threshold voltage of the first-controlled transistor or of the second-controlled transistor, $V_{SB}$ is a voltage difference between a bulk end and a source end of the first-controlled transistor or of the second-controlled transistor, $V_{t0}$ is a threshold voltage of the first-controlled transistor or of the second-controlled transistor when $V_{SB}$ is zero, $\gamma$ is a body effect parameter, and $\phi_B$ is a surface to bulk potential.

4. The phase shift detector in accordance with claim 1, wherein the offset calibration circuit includes a latch, a multiplexer (MUX), a logic gate set, a first bulk voltage generator (BVG) and a second bulk voltage generator, wherein the latch receives the first output voltage and the second output voltage, and outputs a first latch voltage and a second latch voltage, wherein the MUX receives the reference output voltage, a reverse reference output voltage and the first latch voltage, and the MUX selectively outputs the reference output voltage or the reverse reference output voltage according to the first latch voltage, wherein the logic gate set receives the first latch voltage, the second latch voltage, and the reference output voltage or the reverse reference output voltage outputted from the MUX, and the logic gate set respectively outputs a first enable signal and a second enable signal to the first BVG and the second BVG, and wherein the first BVG and the second BVG respectively output the first bulk voltage and the second bulk voltage.

5. The phase shift detector in accordance with claim 4, wherein the first BVG includes a counter which receives a clock signal and the first enable signal, and wherein the counter counts up to output a counting signal according to the clock signal and the first enable signal.

6. The phase shift detector in accordance with claim 5, wherein the first BVG further includes a digital-to-analog converter (DAC) which transfers the counting signal to the first bulk voltage.

7. The phase shift detector in accordance with claim 6, wherein the DAC of the first BVG has a reset end, and a reset signal is transmitted to the reset end of the DAC directly.

8. The phase shift detector in accordance with claim 1, wherein the reset signal is pulled high to reset the DAC when the phase shift detector is operated in a reset mode.

9. The phase shift detector in accordance with claim 4, wherein the logic gate set includes a first AND gate and a second AND gate, wherein the first AND gate receives the second latch voltage, and the reference output voltage or the reverse reference output voltage outputted from the MUX, and the first AND gate outputs the first enable signal, and wherein the second AND gate receives the first latch voltage, and the reference output voltage or the reverse reference output voltage outputted from the MUX, and the second AND gate outputs the second enable signal.

10. The phase shift detector in accordance with claim 1, wherein the first input end and the second input end of the first-stage circuit of the comparator both receive a low potential voltage for detecting an input offset voltage of the comparator when the phase shift detector is operated in a calibration mode.

11. The phase shift detector in accordance with claim 1, wherein the first input end of the first-stage circuit of the comparator receives a sensing signal and the second input end of the first-stage circuit of the comparator receives a low potential voltage for detecting phase of the sensing signal when the phase shift detector is operated in a normal mode.

12. The phase shift detector in accordance with claim 11 further comprises a sensor, wherein the sensor is used for sensing a sample and outputting the sensing signal.

13. The phase shift detector in accordance with claim 12 further comprises a narrow bandpass filter, wherein the narrow bandpass filter is electrically connected to the sensor for filtering the sensing signal, and the first input end of the first-stage circuit of the comparator receives the sensing signal via the narrow bandpass filter.

14. A phase shift detector comprising:
a comparator including:
a first-stage circuit with a first input end and a second input end,
a second-stage circuit electrically connected to the first-stage circuit and including a first-controlled and a second-controlled transistors and outputting a first and a second output voltages and wherein a threshold voltage of the first-controlled transistor or of the second-controlled transistor is presented as:

$$V_{tb}=V_{t0}+\gamma \times (\sqrt{V_{SB}+2\phi_B}-\sqrt{2\phi_B})$$

wherein $V_{tb}$ is the threshold voltage of the first-controlled transistor or of the second-controlled transistor, $V_{SB}$ is a voltage difference between a bulk end and a source end of the first-controlled transistor or of the second-controlled transistor, $V_{t0}$ is a threshold voltage of the first-controlled transistor or of the second-controlled transistor when $V_{SB}$ is zero, $\gamma$ is a body effect parameter, and $\phi_B$ is a surface to bulk potential, and
a third-stage circuit electrically connected to the second-stage circuit and which outputs a reference output voltage and
an offset calibration circuit electrically connected to the comparator and receiving the first output voltage, the second output voltage and the reference output voltage, wherein the offset calibration circuit outputs a first bulk voltage and a second bulk voltage to the first-controlled transistor and the second-controlled transistor respectively according to the first output voltage, the second output voltage and the reference output voltage for controlling the threshold voltage of the first-controlled transistor or of the second-controlled transistor.

15. A phase shift detector comprising:
a comparator including:
a first-stage circuit with a first input end and a second input end,
a second-stage circuit electrically connected to the first-stage circuit and including a first-controlled and a second-controlled transistors and outputting a first and a second output voltages, and
a third-stage circuit electrically connected to the second-stage circuit and which outputs a reference output voltage and
an offset calibration circuit electrically connected to the comparator and receiving the first output voltage, the second output voltage and the reference output voltage, wherein the offset calibration circuit outputs a first bulk voltage and a second bulk voltage to the first-controlled transistor and the second-controlled transistor respectively according to the first output voltage, the second output voltage and the reference output voltage for controlling a threshold voltage of the first-controlled transistor or of the second-controlled transistor and wherein the offset calibration circuit includes a latch, a multiplexer (MUX), a logic gate set, a first bulk voltage generator (BVG) and a second bulk voltage generator, wherein the latch receives the first output voltage and the second output voltage, and outputs a first latch voltage and a second latch voltage, wherein the MUX receives the reference output voltage, a reverse reference output voltage and the first latch voltage, and the MUX selectively outputs the reference output voltage or the reverse reference output voltage according to the first latch voltage, wherein the logic gate set receives the first latch voltage, the second latch voltage, and the reference output voltage or the reverse reference output voltage outputted from the MUX, and the logic gate set respectively outputs a first enable signal and a second enable signal to the first BVG and the second BVG, and wherein the first BVG and the second BVG respectively output the first bulk voltage and the second bulk voltage.

16. A phase shift detector comprising:
   a comparator including:
      a first-stage circuit with a first input end and a second input end and wherein the first input end of the first-stage circuit of the comparator receives a sensing signal and the second input end of the first-stage circuit of the comparator receives a low potential voltage for detecting phase of the sensing signal when the phase shift detector is operated in a normal mode,
      a second-stage circuit electrically connected to the first-stage circuit and including a first-controlled and a second-controlled transistors and outputting a first and a second output voltages, and
      a third-stage circuit electrically connected to the second-stage circuit and which outputs a reference output voltage and
   an offset calibration circuit electrically connected to the comparator and receiving the first output voltage, the second output voltage and the reference output voltage, wherein the offset calibration circuit outputs a first bulk voltage and a second bulk voltage to the first-controlled transistor and the second-controlled transistor respectively according to the first output voltage, the second output voltage and the reference output voltage for controlling a threshold voltage of the first-controlled transistor or of the second-controlled transistor.

* * * * *